United States Patent
Wang et al.

(10) Patent No.: US 6,638,143 B2
(45) Date of Patent: Oct. 28, 2003

(54) ION EXCHANGE MATERIALS FOR CHEMICAL MECHANICAL POLISHING

(75) Inventors: Yuchun Wang, San Jose, CA (US); Stan D. Tsai, Fremont, CA (US); Kapila Wijekoon, Palo Alto, CA (US); Rajeev Bajaj, Fremont, CA (US); Fred C. Redeker, Fremont, CA (US)

(73) Assignee: Applied Materials, Inc., Santa Clara, CA (US)

( * ) Notice: Subject to any disclaimer, the term of this patent is extended or adjusted under 35 U.S.C. 154(b) by 26 days.

(21) Appl. No.: 09/737,414

(22) Filed: Dec. 14, 2000

(65) Prior Publication Data

US 2002/0077035 A1 Jun. 20, 2002

Related U.S. Application Data (60) Provisional application No. 60/171,492, filed on Dec. 22, 1999.

(51) Int. Cl.[7] .................................................. B24B 1/00
(52) U.S. Cl. ........................................................ 451/41
(58) Field of Search ................................. 451/526, 533, 451/41, 530, 527, 534, 539, 60; 106/3; 51/307, 308, 309; 438/692, 693

(56) References Cited

U.S. PATENT DOCUMENTS

| | | | |
|---|---|---|---|
| 4,031,038 A | * | 6/1977 | Grinstead et al. ........ 260/2.2 R |
| 4,169,337 A | | 10/1979 | Payne |
| 4,588,421 A | | 5/1986 | Payne |
| 4,752,628 A | | 6/1988 | Payne |
| 4,867,757 A | | 9/1989 | Payne |
| 5,264,010 A | | 11/1993 | Brancaleoni et al. |
| 5,614,444 A | | 3/1997 | Farkas et al. |
| 5,700,383 A | | 12/1997 | Feller et al. |
| 5,738,574 A | | 4/1998 | Tolles et al. |
| 5,738,800 A | | 4/1998 | Hosali et al. |

(List continued on next page.)

FOREIGN PATENT DOCUMENTS

| | | |
|---|---|---|
| EP | 0 913 442 A2 | 5/1999 |
| WO | 98/49723 | 11/1998 |
| WO | 00/30159 | 5/2000 |
| WO | 00/36037 | 6/2000 |
| WO | WO 00/44034 | 7/2000 |
| WO | 00/49647 | 8/2000 |
| WO | 00/53691 | 9/2000 |

OTHER PUBLICATIONS

V. Brusic, et al., "Copper Corrosion With and Without Inhibitors", *Electrochem. Soc.* 138:8, pp. 2253–2259 (Aug. 1991).

(List continued on next page.)

*Primary Examiner*—Dung Van Nguyen
(74) *Attorney, Agent, or Firm*—Moser, Patterson & Sheridan (57) ABSTRACT

Ion exchange materials are employed in CMP methodologies to polish or thin a semiconductor substrate or a layer thereon. Embodiments include a polishing pad having an ion exchange material thereon and polishing a semiconductor substrate or a layer thereon with the polishing pad or a CMP composition including an ion exchange material therein and polishing the substrate or a layer thereon with the CMP composition or both.

18 Claims, 2 Drawing Sheets

U.S. PATENT DOCUMENTS

| | | |
|---|---|---|
| 5,756,398 A | 5/1998 | Wang et al. |
| 5,769,689 A | 6/1998 | Cossaboon et al. |
| 5,840,629 A | 11/1998 | Carpio |
| 5,844,030 A | 12/1998 | Andros |
| 5,870,793 A | 2/1999 | Choffat et al. |
| 5,876,508 A | 3/1999 | Wu et al. |
| 5,885,362 A | 3/1999 | Morinaga et al. |
| 5,911,835 A | 6/1999 | Lee et al. |
| 5,932,486 A | 8/1999 | Cook et al. |
| 5,958,794 A | 9/1999 | Bruxvoort et al. |
| 5,981,454 A | 11/1999 | Small |
| 6,022,264 A | 2/2000 | Cook et al. |
| 6,022,268 A | 2/2000 | Roberts et al. |
| 6,033,993 A | 3/2000 | Love, Jr. et al. |
| 6,042,741 A | 3/2000 | Hosali et al. |
| 6,046,110 A | 4/2000 | Hirabayashi et al. |
| 6,054,379 A | 4/2000 | Yau et al. |
| 6,068,879 A | 5/2000 | Pasch |
| 6,077,337 A | 6/2000 | Lee |
| 6,083,840 A | 7/2000 | Mravic et al. |
| 6,096,652 A | 8/2000 | Watts et al. |
| 6,099,604 A | 8/2000 | Sandhu et al. |
| 6,117,775 A | 9/2000 | Kondo et al. |
| 6,117,783 A | 9/2000 | Small et al. |
| 6,123,088 A | 9/2000 | Ho |
| 6,136,218 A | 10/2000 | Skrovan et al. |
| 6,136,714 A | 10/2000 | Schutz |
| 6,156,661 A | 12/2000 | Small |
| 6,182,323 B1 | 2/2001 | Bahten |
| 6,207,630 B1 * | 3/2001 | Vaartstra .................... 510/175 |
| 6,276,997 B1 | 8/2001 | Li |
| 6,324,715 B1 | 12/2001 | Hymes et al. |
| 6,416,685 B1 | 7/2002 | Zhang et al. |

OTHER PUBLICATIONS

U.S. patent application Ser. No. 09/401,643, Lie et al., filed Sep. 22, 1999.

U.S. patent application Ser. No. 09/469,708, Lie et al., filed Dec. 21, 1999.

U.S. patent application Ser. No. 09/543,777, Sun et al., filed Apr. 5, 2000.

U.S. patent application Ser. No. 09/544,281, Sun et al., filed Apr. 6, 2000.

U.S. patent application Ser. No. 09/569,968, Sun et al., filed May 11, 2000.

U.S. patent application Ser. No. 09/606,544, Sun et al., filed Jun. 30, 2000.

U.S. patent application Ser. No. 09/608,078, Sun et al., filed Jun. 30, 2000.

U.S. patent application Ser. No. 09/694,866, Wang et al., filed Oct. 23, 2000.

U.S. patent application Ser. No. 09/698,863, Tsai et al., filed Oct. 27, 2000.

U.S. patent application Ser. No. 09/698,864, Sun et al., filed Oct. 27, 2000.

U.S. patent application Ser. No. 09/741,538, Li et al., filed Dec. 20, 2000.

U.S. patent application Ser. No. 09/247,381, Cheung et al., filed Feb. 2, 2001.

* cited by examiner

ION EXCHANGE MATERIALS FOR CHEMICAL MECHANICAL POLISHING

This application claims benefit of U.S. provisional patent application Ser. No. 60/171,492, filed Dec. 22, 1999.

BACKGROUND OF THE INVENTION

1. Field of the Invention

The present invention relates generally to Chemical-mechanical polishing (CMP) and products used therefor. More particularly, the present invention relates to fabricating semiconductor devices by planarizing and/or thinning layers on a semiconductor substrate by CMP. The present invention is applicable to manufacturing high speed integrated circuits having submicron design features and high conductivity interconnect structures with high production throughput.

2. Background of the Related Art

Integrated circuits are typically formed on substrates, particularly semiconductor substrates, such as monocrystalline silicon substrates, by sequentially depositing and etching conductive, semiconductive and/or insulative layers to ultimately form a plurality of features and devices. The active devices, which are initially isolated from one another, are interconnected to form functional circuits and components through the use of well-known multilevel interconnections.

CMP is pervasively employed at strategic stages in the fabrication of semiconductor devices to remove topographical irregularities and/or reduce the thickness of a particular layer to achieve planar surfaces and/or thinner layers. CMP is performed not only on a semiconductor substrate itself, but also on various dielectric layers, barrier layers, conductive layers, or layers containing a combination of the above materials. CMP is, therefore, particularly important in the manufacture of high density multilevel semiconductor devices.

Generally, CMP involves subjecting a target surface to mechanical abrasion and chemical action, as with a polishing pad and abrasive chemical slurry, to effect removal of surface materials. In conventional CMP techniques, a semiconductor substrate in need of planarization and/or thinning is mounted on a carrier or polishing head. The exposed surface of the substrate is then placed against a rotating polishing pad which in turn is mounted on a rotating platen driven by an external driving force. The carrier provides a controllable force, i.e. pressure, urging the substrate against the rotating polishing pad. Additionally, the carrier may rotate to affect the relative velocity distribution over the surface of the substrate. A polishing slurry, typically containing an abrasive and at least one chemically-reactive agent, may be distributed over the polishing pad to provide an abrasive chemical solution at the interface between the pad and substrate.

The slurry initiates the polishing process by chemically reacting with the layer being polished. The polishing process is facilitated by the rotational movement of the pad relative to the substrate as slurry is provided to the substrate/pad interface. The dual mechanisms effect the chemical and mechanical polishing of the target layer.

Polishing is continued in this manner until the desired layer is appropriately planarized, thinned, or removed. The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects, corrosion and erosion.

Conventional polishing pads employed in abrasive slurry processing typically comprise a grooved porous polymeric surface, such as a porous polyurethane surface, and the abrasive slurry varied in accordance with the particular material undergoing CMP. Basically, the abrasive slurry is impregnated into the pores of the polymeric surface while the grooves convey the abrasive slurry to the wafer undergoing CMP.

Although conventional CMP is pervasively employed throughout the semiconductor manufacturing process with similar success and limitations, CMP of metal layers in the fabrication of interconnects for integrated circuits have proved particularly problematic. In applying conventional CMP planarization techniques to a metal layer, such as a copper (Cu) film, it is extremely difficult to achieve a high degree surface uniformity, particularly across a surface extending from a dense array of Cu features, e.g., Cu lines, bordered by an open field.

A dense array of metal (Cu) features is typically formed in an interlayer dielectric, such as a silicon oxide layer, by a damascene technique wherein trenches are initially formed. A barrier layer, such as a Ta-containing layer e.g., Ta, TaN, is then deposited lining the trenches and on the upper surface of the silicon oxide interlayer dielectric. Cu or a Cu alloy is then deposited, as by electroplating, electroless plating, physical vapor deposition (PVD) at a temperature of about 50° C. to about 150° C. or chemical vapor deposition (CVD) at a temperature under about 200° C., typically at a thickness of about 8,000 Å to about 18,000 Å. In planarizing the wafer surface after copper metallization, erosion and dishing are typically encountered, thereby decreasing the degree of surface uniformity or planarity and challenging the depth of focus limitations of conventional photolithographic techniques, particular with respect to achieving submicron dimensions, such as below about 0.18 micron.

Conventional techniques for CMP Cu and Cu alloys consequently exhibit unacceptably low polishing rates or poor polishing results. Conventional CMP slurries for Cu and Cu alloys contain abrasive particles, an oxidizer, a complexing agent, and a film forming agent. Conventional CMP operates by oxidizing the surface of the metal to a metal oxide. The complexing agent also has a propensity to oxidize the metal but is added primarily to complex and dissolve the formed metal oxide into the slurry. Abrasion by the abrasive particles completes the removal and planarization of the metal layer.

The oxidizers form an oxide film on the metal layer and typically stop etching once a thin oxide film forms. Conventional complexing agents are small organic molecules, such as a carboxylic acids, amines, their salts. The complexing agents, however, tend to attack the metal layer as well as any formed oxide film further etching the metal layer. Further, the use of small molecules tends to diffuse to the metal/oxide interface, or simply diffuses through the less dense oxide film due to their small size and affinity for the metal surface causing continued etching of the target metal. Such over-etching of metal lines results in dishing which may form capillary forces to suck the aqueous solution thereby exacerbating dishing. Currently, dishing is a significant problem in CMP of metal layers, particularly Cu and Cu alloys.

Another difficulty of polishing substrate is achieving uniform planarity of the substrate surface. Uniform planarity includes the uniform removal of material from the surface of substrates as well as removing non-uniform layers which have been deposited on the substrate. For example, the edge area, or bevel edge, of the substrate may receive an excess amount or minimal amount of deposition, typically referred to as an edge bead, during the deposition process. This edge area of the substrate is often described as the edge bead removal (EBR) area.

Excess materials, such as copper or tungsten, deposited on the beveled edge of a substrate tends to flake or peel off during chemical mechanical polishing, which particles may damage adjacent portions of the substrate and can detrimentally affect processing uniformity by the polishing pad on subsequent substrates. Material may also be deposited on the backside of the substrate which is not normally removed during a polishing process and also provides a potential source of particle during processing. Alternatively, minimal depositions of material are not planarized in many conventional polishing processes and may also result in a non-planar surface. Therefore, the copper or tungsten deposited on the bevel edge and EBR area is usually of a different level as the tungsten material deposited on the rest of the substrate surface which particles can detrimentally affect subsequent uniformity in a polishing process. However, the different levels of material on the substrate surface make removal of the non-planar depositions and the formation of a planarized surface difficult with current processes.

Improved CMP materials and methodology for planarizing and/or thinning layers and thin films associated with smaller-sized design features in semiconductor fabrication is needed which reduce surface imperfections, defects and erosion. There exists a particular need for a CMP composition for planarizing Cu and Cu metal alloy layers with reduced dishing, increased surface planarity, increased throughput and reduced manufacturing costs.

SUMMARY OF THE INVENTION

An aspect of the present invention is a CMP composition for planarizing and/or thinning a semiconductor substrate or layers thereon, particularly metal layers, such as copper containing layers. Another aspect of the present invention is a polishing pad for CMP for planarizing and/or thinning a semiconductor substrate or layers thereon with improved surface planarity, increased throughput and reduced manufacturing costs.

Additional aspects and other features of the present invention will be set forth in part in the description which follows and in part will become apparent to those having ordinary skill in the art upon examination of the following or may be learned from the practice of the present invention. The aspects of the present invention may be realized and obtained as particularly pointed out in the appended claims.

According to the present invention, the foregoing and other aspects are implemented in part by a CMP composition comprising an ion exchange material in a carrier, such as an aqueous medium, e.g. deionized water or a mixture of deionized water with a lower alcohol, glycol, etc. The ion exchange material of the present invention comprises a matrix material, e.g. a polymer or ceramic, having a plurality of fixed ligands capable of complexing with and/or chelating material produced during a CMP polishing process, such as metals or metal ions produced during the polishing of metal containing layers.

Embodiments include a CMP composition comprising no less than about 0.5 wt % of the ion exchange material and no less than about 0.005 wt % of at least one oxidizing agent, no less than about 1 wt % of at least one abrasive in an aqueous carrier. The ion exchange material can be capable of complexing with a metal or metal ions in the aqueous carrier and be in the form of beads having an average diameter of less than 1 micron to about 500 microns. In an embodiment of the present invention, the ion exchange material function as an abrasive and, hence, replace the conventional abrasive particles in the composition.

Another aspect of the present invention is a polishing pad for CMP comprising an ion exchange material. Embodiments include a polishing pad containing a matrix material having a plurality of fixed moieties capable of complexing with materials produced by the polishing and chemical activity in a CMP process.

Embodiments include a polishing pad comprising a base and the ion exchange material on the base having a substantially planar surface for contacting a semiconductor substrate. In another embodiment of the present invention, the ion exchange material is embedded in the polishing pad.

A further aspect of the present invention is a method for polishing a semiconductor substrate. The method comprises providing a substrate and a means for polishing or thinning the substrate or a layer thereon.

Embodiments include polishing the substrate or a layer thereon with a polishing pad comprising an ion exchange material or polishing the substrate with a CMP composition comprising an ion exchange material or both.

In another aspect, the invention provides a method of polishing a substrate, the method comprising providing a substrate having a bevel edge, providing a cleaning pad comprising an ion exchange material, and polishing the substrate with the cleaning pad.

Additional aspects of the present invention will become readily apparent to those skilled in this art from the following detailed description, wherein embodiments of the present invention are described, simply by way of illustration of the best mode contemplated for carrying out the present invention. As will be realized, the present invention is capable of other and different embodiments, and its several details are capable of modifications in various obvious respects, all without departing from the present invention. Accordingly, the drawings and description are to be regarded as illustrative in nature, and not as restrictive.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

The present invention relates to the use of ion exchange materials for complexing and/or chelating ions formed during the CMP process. Such ion exchange materials are capable of effecting chemical activity in a CMP process without the deleterious effect of etching or eroding the target layer. Without being bound to any theory, it is believed that since the ion exchange material is relatively large compared to the underlying features (e.g. metal lines) of the target layer, the ion exchange material can not diffuse through or easily etch into the target layer thereby limiting the chemical activity to the medium comprising the CMP composition. It is further believed that the chemical activity of the ion exchange material is limited to the surface of the target layer thereby effecting chemical activity without the attendant etching or erosion which is prevalent in penetrating small, chemically active agents. Hence, the present invention is directed to the concept of employing ion exchange materials in addition to, or, as a substitute for, chemically active agents in CMP methodologies to address and minimize problematic dishing and erosion encountered in the manufacture of high density integrated circuits, particularly in the polishing and/or thinning of layers associated with the fabrication of interconnects.

As used herein, an ion exchange material refers to a material having an extended, open molecular framework that includes electrically charged or chargeable groups capable of forming complexes with anions or cations. These chargeable functional groups serve as active, fixed sites bound to a matrix material where materials removed during CMP can be captured and retained.

Many ion exchange materials are known and are suitable for use in embodiments of the present invention. These suitable ion exchange materials include synthetic ion exchange resins, macroporous resins and synthetic inorganic exchanges, such as ceramic molecular sieves. The ion exchange materials for use in the present invention can complex or chelate with materials, such as metals or ions, formed during CMP and in the CMP medium without adversely affecting the target surface subjected to CMP. Complexation and/or chelation of materials in the CMP medium can occur at the surface or at the interior of a porous ion exchange material.

Ion exchange materials can be tailored to complex or chelate with particular ions. Many commercially available ion exchange materials are manufactured as polymeric resins, such as chelating ion exchange resins.

As used herein, a complexing or chelating ion exchange resin is one that has at least one ligand bound to a polymer matrix and where the ligand can complex, chelate or otherwise retain a species produce during a CMP process, such as a styrene/divinylbenzene chelating ion exchange resin. Suitable ion exchange resins are available from the Rohm and Haas Company.

Ion exchange resins can be tailored for complexing with metals or their ions, such as copper metal and copper ions. Such resins are commercially available, such as a styrenic resin having one or more amine and/or pyridinyl groups, from the Dow Chemical, Co of Midland Mich. and disclosed, for example, in U.S. Pat. No. 4,031,038. Styrene-divinylbenzene resin having a plurality of picolylamine groups, e.g. 2-picolylamine, N-methyl-2-picolylamine, N-(2-hydroxyethyl)-2-picolylamine, N-(2-methylaminoethyl)-2picolylamine and bis-(2-picolyl)amine, have a high capacity for complexing and retaining metals and metal ions, particularly copper and nickel, from dilute aqueous media.

Ion exchange resins can be manufactured in a variety of different physical forms, such as a porous bead, film, membrane, fiber, or irregularly shaped particles. For the production of spherical ion exchange resins, suspension polymerization has been conventionally employed. According to such methods, a mixture comprising at least one monofunctional monomer, at least one polyfunctional monomer and at least one functionalized monomer having chemically reactive functional groups are admixed and typically polymerized in an aqueous medium to obtain a spherical cross-linked copolymer. The cross-linked resins can be further reacted to form cation or anion exchange resins. The spherical copolymers can be polymerized or further processed to bead from having an average size of less than one micron to about several 100 microns or higher.

Examples of the monofunctional monomer include a monovinyl aromatic monomer such as styrene, alkyl-substituted styrene, (e.g. vinyltoluene and ethylvinylbenzene), halogen-substituted styrene (e.g. bromo or chlorostyrene), or vinylnaphthalene; and an aliphatic monomer such as an acrylic or methacrylic monomer, e.g. methacrylic acid, methacrylate, methacrylamide and acrylonitrile. Examples of the polyfunctional monomers include substituted or unsubstituted polyvinyl aromatic monomers, such as divinylbenzene, divinyltoluene, divinylxylene, divinylnaphthalene, trivinylbenzene, divinyldiphenylether, divinyldiphenylsulfone; and unsubstituted aliphatic polyacrylic monomers such as alkylene di-methacrylate, e.g. ethylene glycol or diethylene glycol dimethacrylate and the like, alkylene polymethacrylate, e.g. trimethylolpropane trimethacrylate and the like, or alkylene polymethacrylamide, e.g. N,N'-methylene dimethacrylamide and the like. Examples of functionalized monomers include N-hydroxymethylacrylamide, vinyl phenol, dicyclopentenyl methacrylate, hydroxymethylated diacetone acrylamide, allyl N-methylolcarbamate, formyl-N'-acryloyl methylenediamine, 2-acetoacetoxyethyl methacrylate, 2-cyanoacetoxyethyl methacrylate, N-(2-acetoacetoxyethyl) acrylamide, and N(2-acetoacetamidoethyl)methacrylamide.

Ion exchange resins can also be prepared by condensation polymerization, such as in the manufacture of phenol-formaldehyde resins. The ion exchange resins made by condensation polymerization can also be prepared as a film, membrane, fiber, irregularly shaped particles or other physical forms depending primarily on the form of the initial matrix resin.

After polymerization, the resins can be further derivatized with functional groups, such as reacting a cross-linked matrix resin substituted with halo groups with certain aminopyridines to give an ion exchange resin with pendent methyleneaminopyridine ligands attached to the matrix resin.

Polishing pads for planarizing and thinning semiconductive, insulative and conductive substrates and layers containing those materials are known and their manufacture is also known. In accordance with the present invention, a polishing pad for CMP comprises an ion exchange material. The inventive polishing pad can be constructed as a disk-like or belt-like article having a substantially planar surface for contacting a semiconductor substrate and can be made entirely of at least one ion exchange material or can be made of various conventional materials with at least one ion exchange material on or near the surface of the pad for contact with the substrate.

Figure 1:
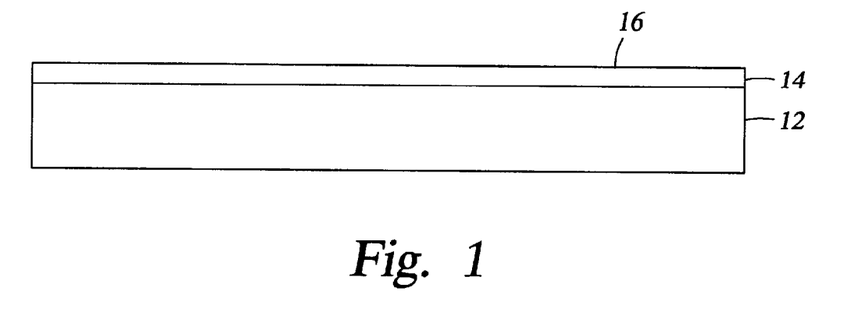
FIGS. 1 and 2 schematically depict different embodiments of a polishing pad of the present invention.
Figure 2:
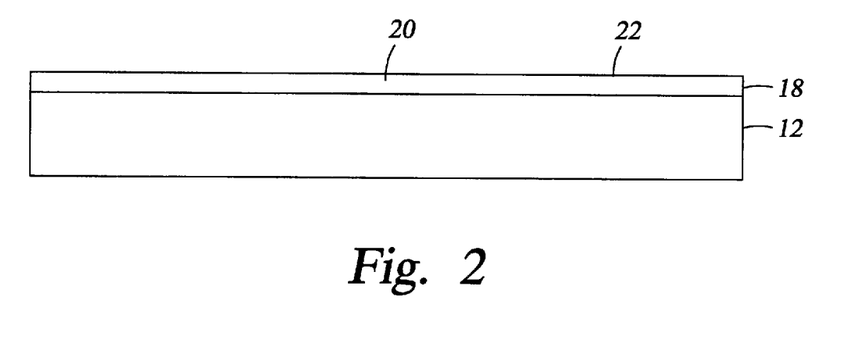

For example, FIGS. 1 and 2 illustrate polishing pad arrangements of the present invention. As shown in FIG. 1, the present invention can be implemented by a polishing pad comprising base 12 with ion exchange material 14 on base 12. The ion exchange material is in the form of a layer over the base and has a substantially planar surface 16 for contacting a semiconductor substrate (not shown).

Base 12 can be made of conventional polishing pad materials, such as a nylon, polyurethane etc. Ion exchange material 14 can be in the form of a porous sheet or a plurality of porous sheets laminated or otherwise attached to base 12.

FIG. 2 illustrates another implementation of a polishing pad comprising an ion exchange material. As shown in this embodiment, base 12 has layer 18 thereon which comprises a plurality of embedded or impregnated ion exchange particles 20 therein. Layer 18 has a substantially planar face 22 for contacting a semiconductor substrate and can be a porous polymeric layer, such as a polyurethane retaining the impregnated or embedded ion exchange particles. The ion exchange particle need not be fully impregnated in layer 18. For example, the present invention also contemplated a polishing pad having a plurality of ion exchange particles, such as beads, attached to the surface of a polishing pad.

The polishing pads of the present invention can be tailored to the specific target layer in of CMP. For example, employing conventional techniques, the ion exchange material can be fabricated as a porous cross-linked resin having a plurality of functional groups capable of complexing and/or chelating with materials removed during the CMP process. In an embodiment of the present invention, ion exchange material 14 and particles 20 comprise a porous styrenic resin having a plurality of amine or pyridinyl functional groups.

In addition to, or separately, ion exchange materials can be employed in a CMP composition during CMP of a semiconductor substrate or layer thereon. In practicing an embodiment of the present invention, a CMP composition is prepared by admixing an ion exchange material with a carrier, e.g. deionized or distilled water, lower alcohol, glycol or mixtures thereof.

As used herein a CMP composition refers to a composition that can be applied to a semiconductor substrate or a layer thereon during CMP to facilitating planarizing and/or thinning the semiconductor substrate or a layer thereon. The present invention contemplates a CMP composition comprising an ion exchange material, e.g. an ion exchange resin in the form of spherical shaped beads having an average diameter of less than 1 micron to about 500 microns, e.g. beads having an average diameter of about 0.2 micron to about 100 microns.

The ion exchange material of the present invention can further act as an abrasive thereby reducing or eliminating the need for additional abrasive components in the composition. The ion exchange material is present in an amount effective to aid in CMP. For example, the ion exchange material can be in an amount of from about 0.05 wt % to about 50 wt %, e.g. from about 0.5 wt % to about 25 wt % of the composition.

In an embodiment of the present invention, the CMP composition comprises an ion exchange resin capable of complexing with a metal or metal ions in the aqueous carrier, e.g. a styrenic matrix resin having a plurality of functional groups capable of complexing and/or chelating a metal or metal ion.

Additional components can be added to the inventive CMP composition. For example the CMP composition can also include at least one oxidizing agent. The oxidizing agent is useful in the CMP composition in oxidizing the semiconductor substrate or target layer thereon to its corresponding oxide, hydroxide, or ions.

As used herein, an oxidizing agent is generally an agent that accepts electrons from the target layer thereby causing oxidation of the target layer. For example, in the present invention, the oxidizing agents may be used to oxidize a metal layer to its corresponding oxide or hydroxide, e.g., titanium to titanium oxide, tungsten to tungsten oxide, copper to copper oxide, and aluminum to aluminum oxide. The oxidizing agents of this invention are useful when incorporated into a CMP composition to polish metals and metal based components including titanium, titanium nitride, tantalum, copper, tungsten, aluminum, and aluminum alloys such as aluminum/copper alloys, and various mixtures and combinations thereof by mechanically polishing the metals to remove the respective oxide layer.

Oxidizers useful in the present invention comprise peroxy compounds, e.g. compounds which may disassociate through hydroxy radicals. Such peroxy compounds include hydrogen peroxide and its adducts such as urea hydrogen peroxide and percarbonates, organic peroxides such as benzoyl peroxide, peracetic acid, and di-t-butyl peroxide, monopersulfates, dipersulfates, sodium percarbonate and sodium peroxide. The oxidizing agent can also be an inorganic or a compound containing an element in its highest oxidation state. Examples of inorganics and compounds containing an element in its highest oxidation state include but are not limited to periodic acid, periodate salts, perbromic acid, perbromate salts, perchloric acid, perchloric salts, perbonic acid, nitrate salts (such as cerium nitrate, iron nitrate, ammonium nitrate), perborate salts and permanganates. Other oxidizing agents include bromates, chlorates, chromates, iodates, iodic acid, and cerium (IV) compounds such as ammonium cerium nitrate.

The oxidizer can be present in the CMP composition in an amount ranging from about 0.05 to about 90 weight percent (wt %), e.g. from about 0.1 wt % to about 20 wt %. In an embodiment of the present invention, the CMP composition comprises about 0.1 wt % to about 15 wt % of hydrogen peroxide.

The CMP composition can also include an abrasive. The abrasive is typically a metal oxide abrasive. The metal oxide abrasive may be selected from the group including alumina, titania, zirconia, germania, silica, ceria and mixtures thereof In an embodiment of the present invention, the CMP composition includes from about 1.0 wt % to about 50 wt %, e.g. from about 2 wt % to about 20 wt % an abrasive.

Additional conventional components can be incorporated into the CMP composition of the present invention to achieve their known effect. For example, a film forming agent can be added and can be any compound or mixtures of compounds that are capable of facilitating the formation of a passivation layer of metal oxides and dissolution inhibiting layers on the surface of a metal layer. Useful film forming agents are cyclic compounds such as imidazole, benzotriazole, benzimidazole and benzothiazole and their derivatives with hydroxy, amino, imino, carboxy, mercapto, nitro and alkyl substituted groups, as well as urea, thiourea and others.

Although employment of an ion exchange material in the present CMP composition minimizes or even eliminates the need for additional complexing agents, it may be beneficial to add complexing agents for certain applications. In this regard, a wide range of conventional organic acids, salts of organic acids, and mixtures thereof are useful in the CMP composition of the present invention to enhance the selectivity to oxide polishing rate, such as monofunctional acids, di-functional acids, hydroxyl/carboxylate acids, chelating, non-chelating acids, and their salts. The organic acid can be selected from the group of acetic acid, adipic acid, butynic acid, capric acid, caproic acid, caprylic acid, citric acid, glutaric acid, glycolic acid, formic acid, fumaric acid, lactic acid, lauric acid, malic acid, maleic acid, malonic acid, myristic acid, oxalic acid, palmitic acid, phthalic acid, propionic acid, pyruvic acid, stearic acid, succinic acid, tartaric acid, valeric acid and derivatives, including salts thereof Other well known polishing additives may be incorporated into the chemical mechanical polishing composition of this invention. One type of optional additives are inorganic acids and/or salts thereof which may be added to the polishing slurry to further improve or enhance the polishing rate of the barrier layers in the wafer, such as titanium and tantalum. Useful inorganic additives include sulfuric acid, phosphoric acid, nitric acid, ammonium salts, potassium salts, sodium salts or other cationic salts of sulfates and phosphates.

In order to promote stabilization of the polishing slurry including oxidizing agents against settling, flocculation and decomposition, a variety of optional additives, such as surfactants, stabilizers, or dispersing agents, can be used. If a surfactant is added to the CMP slurry, then it can be an anionic, cationic, nonionic, or amphoteric surfactant or a combination of two or more surfactants can be employed. Furthermore, it has been found that the addition of a surfactant may be useful to improve the within-wafer-non-uniformity (WIWNU) of the wafers, thereby improving the surface of the wafer and reducing wafer defects. Non-limiting examples of preferred stabilizers useful in the CMP slurry of this invention include but are not limited to phosphoric acids such as aminotri(methylenephosphonic) acid, 1-hydroxyethylidene-4-diphosphonic acid, hexamethylenediaminetetramethylene phosphoric acid, and diethylenetetramine pentamethylenephosphonic acid. One or more stabilizers may be present in the CMP slurry of this invention in an amount that is sufficient to produce measurable improvements in slurry stability, and generally in an amount ranging from about 100 ppm to about 5.0 weight percent (wt. %).

Stabilizers can be added to CMP composition of this invention including phosphoric acids and salts thereof. The addition of one or more phosphoric acids to the CMP composition of this invention may also inhibit metallic corrosion.

Given the present disclosure and objectives, suitable amounts of reagents and additional components can be determined and optimized in a given situation. Generally, the present invention is applicable for CMP of various metals, such as aluminum, Cu, titanium, tantalum, nitrides thereof, as well as insulative, and semiconductive layers. CMP compositions in accordance with embodiments of the present invention can typically contain about 0.005 wt % to about 50 wt. % of the ion exchange material, such as about 0.05 to about 20 wt. %, e.g., about 0.5 to about 2.5 wt. %. An oxidizing agent, such as can be present in an amount of about 0.05 wt % to about 20 wt %, e.g. 0.1 to about 10 wt %. The CMP composition of the present invention can further optionally include an abrasive, e.g. silicon oxide and/or aluminum oxide, in an amount, if present from 0.1 wt % to about 30 wt %, e.g. from about 2 wt % to about 20 wt %. In addition, an optional triazole or triazole derivative can be provided within the composition. The remaining balance of the composition is typically deionized water and/or an alcohol solution.

In practicing the present invention, a semiconductor substrate or layer thereon in need of planarization and/or thinning is subjected to CMP employing a CMP composition comprising an ion exchange material or a polishing pad comprising an ion exchange material or both. The present invention contemplates employing the ion exchange material in a single stage or in multiple stages of an in-line, batch and/or multi-step polishing processes. By way of example, a complete description of a continuous CMP process and apparatus therefore can be found in U.S. Pat. No. 5,738,574.

Figure 3:
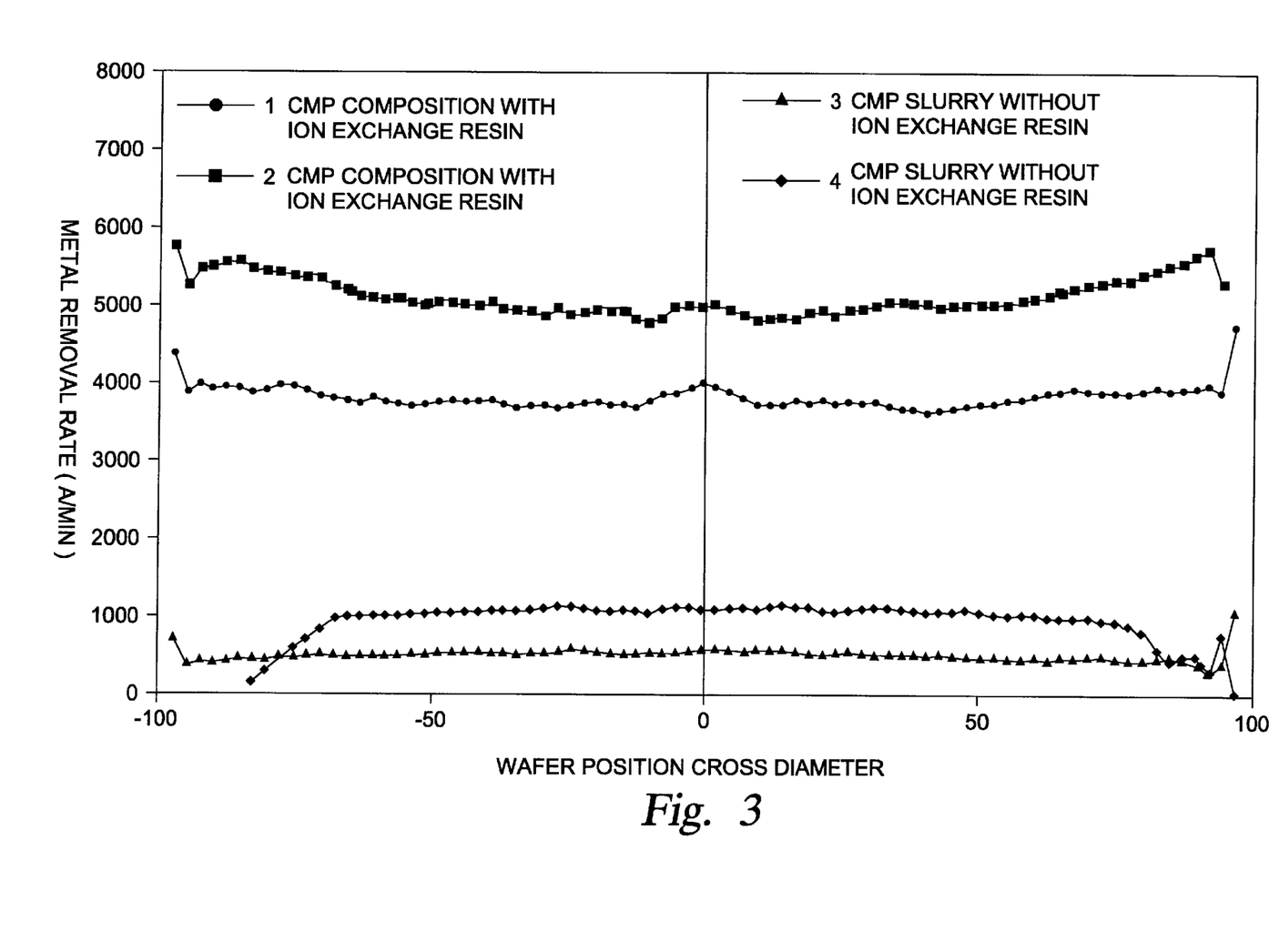
FIG. 3 demonstrates high CMP polishing rates and uniformity achieved employing with CMP compositions of the present invention compared to CMP slurries without ion exchange materials.

For example, FIG. 3 demonstrates the applicability of a CMP composition of the present invention to polishing a metal film on a semiconductor substrate. The CMP compositions were prepared by admixing about 1 wt % to about 3 wt % of a styrene-divinylbenzene resin having a plurality of picolylamine groups, as the ion exchange material, with about 1 wt % to about 3 wt % of hydrogen peroxide, and about 1 wt % to about 5 wt % of silica with the remainder being deionized water. As shown, CMP compositions of the present invention having an ion exchange resin achieved polishing rates of about 4,000 Å/mm to about 5,000 Å/mm with good uniformity across the substrate diameter, i.e. CMP compositions 1 and 2. Polishing the substrates without the ion exchange materials resulted in poor polishing rates, i.e. compositions 3 and 4.

An application for the ion exchange materials employed in this invention is in the CMP of interconnects, e.g. CMP of thin layer films comprising tantalum nitride, titanium nitride, aluminum tungsten and copper. Interconnection structures typically have a first layer of metallization, comprising a conductive pattern and interwiring spaces, a second level of metallization, and frequently third and subsequent levels of metallization. Interlevel dielectrics, such as doped and undoped silicon dioxide, are used to electrically isolate the different levels of metallization in a silicon substrate. Typically, conductive patterns on different layers, i.e. upper and lower layers, are electrically connected by a conductive plug filling a via hole, while a conductive plug filling a contact hole establishes electrical contact with an active region on a semiconductor substrate, such as a source/drain region. Conductive lines are formed in trenches which typically extend substantially horizontal with respect to the semiconductor substrate. Semiconductor "chips" comprising five or more levels of metallization are becoming more prevalent as device geometries shrink to submicron levels.

Figure 4:
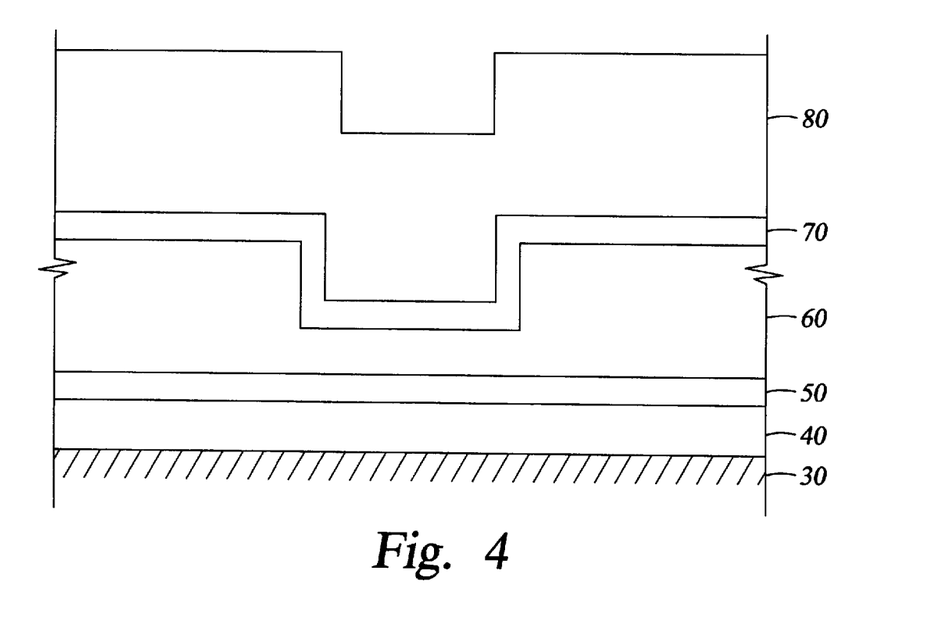
FIG. 4 schematically shows an interconnect structure prior to polishing.

Although not specifically illustrated in FIG. 4, conventional integrated circuit processing is used to form field isolation and active electrical devices (e.g., capacitors, MOSFETs, bipolar devices, diodes, logic gates, etc.) over the surface of the starting substrate material. These layers are inherently and collectively illustrated as the bottom/base layer 30 in FIG. 4. These active devices formed over the substrate are interconnected by semiconductive layers such as polysilicon, amorphous silicon, or salicided regions. In the alternative, these active circuits may also be interconnected by metallic interconnects or some combination of semiconductive interconnects and metallic interconnects Referring the FIG. 4, a composite interconnect arrangement is illustrated prior to planarization. The composite arrangement comprises semiconductor substrate 30 having dielectric layer 40 thereon, silicon nitride layer 50 on the dielectric film 40, and a second dielectric film 60, such as a silicon dioxide film, e.g. PETEOS, overlaying silicon nitride 50. In other forms, dielectric film 60 can be a low-k dielectric, borophosphosilicate glass (BPSG), fluorinated TEOS (FTEOS), polymer materials, plasma enhanced TEOS (PETEOS), composites thereof, and the like.

Barrier film 70 having a thickness of about 200–500 Å overlays dielectric layer 60. Typical barrier films include tantalum nitride, titanium nitride, titanium tungsten, tantalum, titanium, tantalum silicon nitride, tungsten nitride, alloys of these materials, composites thereof, etc. A conductive layer 80 is then deposited over a top surface of the layer 70, within the via opening in layer 60. Conductive layer 80 can be a metal interconnect, a material such as tungsten, aluminum, and aluminum alloy, copper, gold, silver, refractory metals, conductive oxides, composites thereof, or the like.

In accordance with fabricating a copper interconnection, conductive layer 80 comprises copper and has an initial thickness of about 5,000–10,000 Å overlaying barrier film 70. Planarizing a copper layer, as depicted in FIG. 4, of the present invention is achieved by employing a multi-step process with a strategic ion exchange material.

In an embodiment of the present invention, a multi-step CMP process is employed comprising: CMP of the conductive layer employing either a polishing pad comprising an ion exchange material or a CMP composition comprising an ion exchange material or both and stopping on the barrier layer; removing the barrier layer; buffing the surface of the interlayer dielectric to reduce or eliminate scratching and defects; and rinsing and protecting the planarized metal surface.

In an embodiment of the present invention a copper containing layer is formed over the barrier layer as the conductive layer and the ion exchange material comprises an ion exchange material capable of complexing with a metal or metal ions. Other features of the present invention include, a CMP composition comprising a styrenic polymer having at least one amine or pyridinyl moiety in the form of spherical beads. The beads can have an average diameter of from about 1 micron to about 500 microns, e.g. from about 10 microns to about 150 microns. In an embodiment of the present invention, the CMP composition also includes an oxidizer, e.g. hydrogen peroxide, of about 0.1 wt % to about 5 wt % in an aqueous carrier, e.g. deionized water.

In accordance with embodiments of the present invention, a Cu metal film is effectively planarized with no or substantially reduced dishing, thereby enabling the use of conventional photolithography to form metal features having dimensions in the deep submicron range. A typical Cu metallization or interconnect system comprises, but is not limited to, interconnects formed by damascene and comprises depositing an interlayer dielectric overlying a substrate, forming an opening, e.g., a damascene opening, in the interlayer dielectric, depositing a diffusion barrier, such as a TaN or Ta, and filling the opening with Cu. Advantageously, the opening in the interlayer dielectric can be filled by initially depositing a seedlayer and then electroplating or electroless plating the Cu layer, typically at a thickness of about 8,000 to about 18,000 Å. The damascene openings can also be filled with Cu by PVD at a temperature of about 50° C. to about 150° C. or by CVD at a temperature under about 2000° C.

Conventional substrates and interdielectric layers are encompassed by the present invention. For example, the substrate can be doped monocrystalline silicon, gallium, germanium, amorphous silicon, or gallium arsenide. The interlayer dielectric can comprise any of various dielectric materials conventionally employed in the manufacture of semiconductor devices. For example, dielectric materials, such as silicon dioxide, phosphorus-doped silicon glass (PSG), boron-phosphorus-doped silicon glass (BPSG) and silicon dioxide derived from tetraethyl orthosilicate (TEOS) or silane by plasma enhanced chemical vapor deposition (PECVD) can be employed. Interlayer dielectrics in accordance with the present invention can also comprise low dielectric constant materials, including polymers, such as polyimides, and carbon-containing silicon dioxide, e.g., Black Diamond™ available from Applied Materials Inc., located in Santa Clara, Calif. The openings are formed in interlayer dielectrics by conventional photolithographic and etching techniques.

The present invention provides a polishing pad comprising an ion exchange material and a CMP composition for planarizing metals, such as Cu at a high removal rate, e.g., greater than about 4,000 Å per minute with reduced dishing, thereby enabling an improvement in the speed of the resulting integrated circuit and yield. Embodiments of the present invention, therefore, enable manufacturing semiconductor devices having enhanced cross-sectional area of copper interconnects, thereby improving electrical performance by reducing interconnect resistance.

In another embodiment of the invention, the ion exchange material is used in cleaning or buffing of a substrate. A substrate having a bevel edge is provided to a polishing apparatus having a cleaning module position adjacent or disposed therein, a cleaning or buffering pad is disposed in the cleaning module, the cleaning pad comprising an ion exchange material, and the cleaning or buffering pad is contacted with the substrate and the surface, bevel, and/or backside of the substrate is polished.

Embodiments of the cleaning pad including the ion exchange material described herein can be implemented by a cleaning pad comprising a base with a layer of ion exchange material disposed on the base. The ion exchange material may be in the form of a layer over the base and has a substantially planar surface for polishing a substrate surface. The base can be made of a conventional material of buffing or polishing pads, such as nylon, polyurethane, and other components.

The ion exchange material can be in the form of a porous sheet or plurality of porous sheets laminated or otherwise coupled to a base material. For example, the ion exchange material can be fabricated as a porous crosslinked resin having a plurality of functional groups capable of complexing and/or chelating with materials removed during the cleaning or buffering process.

In another embodiment of the present invention, ion exchange material and particles comprise a deformable, porous styrenic resin having a plurality of amine or pyridinyl functional groups. The porous sheets may have a compressive stress between about 0.1 kg/cm$^2$ and about 50 kg/cm$^2$ or between about 0.01 megaPascals and about 5 megaPascals or otherwise have sufficient flexibility to deform and polishing the bevel edge and/or backside of a wafer when contacting a wafer surface. A porosity between about 50 vol % and 90 vol % of the sheet is used in one aspect of the ion exchange material.

Alternatively, the cleaning or buffering pad includes the ion exchange material embedded or impregnated in a binder material having a porous nature, such as a porous polymeric material, to form a porous pad. An example of such a cleaning or buffering pad is a porous polyurethane pad having ion exchange particles disposed therein and having a compressive stress between about 10 kg/cm$^2$ and about 50 kg/cm$^2$ or between about 1 megaPascals and about 5 megaPascals with a porosity between about 50 vol % and 90 vol %, and sufficiently capable of deforming to contact a bevel edge of a substrate.

It is believed that contact between the substrate surface and the cleaning pad containing the ion exchange material will allow removal of metal particles or residue from the substrate surface with limited or minimal removal of metal layers formed thereon. The invention further contemplates the use of ion exchange materials in other embodiments such as a cleaning brush.

The present invention is applicable to planarizing during various stages of semiconductor manufacturing. The present invention enjoys particular applicability in the manufacture of high density semiconductor devices with metal features in the deep submicron range. Only the preferred embodiment of the present invention and but a few examples of its versatility are shown and described in the present disclosure. It is to be understood that the present invention is capable of use in various other combinations and environments and is capable of changes and modifications within the scope of the inventive concept as expressed herein.

While the foregoing is directed to the preferred embodiment of the present invention, other and further embodiments of the invention may be devised without departing from the basic scope thereof, and the scope thereof is determined by the claims that follow.

What is claim is:

1. A method of polishing a substrate, the method comprising:

providing a semiconductor substrate; and polishing the substrate with a CMP composition comprising an ion exchange polymer comprising a styrenic resin having at least one amine, pyridinyl group, picolylamine group, aminopyridines, or combinations thereof.

2. The method of claim 1, further comprising:

forming a dielectric layer on the substrate;

forming a barrier layer on the dielectric layer;

forming a conductive layer over the barrier layer;

polishing the conductive layer with the CMP composition until a portion of the barrier layer is exposed; and polishing the barrier layer to expose a top surface of the dielectric layer.

3. The method of claim 2, wherein the conductive layer is a copper containing layer.

4. The method of claim 3, wherein the ion exchange polymer comprises an ion exchange polymer capable of complexing with copper or copper ions.

5. A method of polishing a substrate, comprising:

providing a semiconductor substrate;

forming a dielectric layer on the substrate;

forming a barrier layer on the dielectric layer;

forming a conductive layer that is a copper containing layer over the barrier layer;

polishing the conductive layer with a CMP composition comprising an oxidizer in an aqueous carrier and an ion exchange polymer comprising a styrenic polymer having at least one amine or pyridinyl moiety that is in the form of beads having an average diameter of less than 1 micron to about 500 microns, and that is capable of complexing with copper or copper ions until a portion of the barrier layer is exposed; and polishing the barrier layer to expose a top surface of the dielectric layer.

6. A method of polishing a substrate, the method comprising:

providing a semiconductor substrate; and polishing the substrate with a polishing pad, wherein the polishing pad comprises an ion exchange material comprising a styrenic resin having at least one amine, pyridinyl group, picolylamine group, aminopyridines, or combinations thereof.

7. The method of claim 6, wherein the ion exchange material is capable of complexing with a metal or metal ions.

8. The method of claim 7, further comprising:

forming a dielectric layer on the substrate;

forming a barrier layer on the dielectric layer;

forming a copper containing layer on the barrier layer; and polishing the copper containing layer with the polishing pad.

9. The method of claim 6, wherein polishing the substrate with the polishing pad comprises polishing the substrate with a CMP composition comprising an ion exchange material.

10. A method of cleaning a substrate, the method comprising:

providing a substrate having a bevel edge; providing a cleaning pad comprising a deformable ion exchange material comprising a styrenic resin having at least one amine, pyridinyl group, picolylamine group, aminopyridines, or combinations thereof; and polishing the bevel edge of the substrate with the cleaning pad.

11. The method of claim 10, wherein the ion exchange material is embedded in a binder-material.

12. The method of claim 11, wherein the binder material is a porous polymeric material.

13. The method of claim 11, wherein the binder material is a deformable material.

14. The method of claim 10, the ion exchange material is capable of complexing with a metal or metal ions.

15. The method of claim 10, wherein the cleaning pad comprises an ion exchange material polymer sheet.

16. The method of claim 15, wherein the polymer sheet has a porosity between about 50 vol % and 90 vol %.

17. the method of claim 15, wherein the cleaning pad has a compressive stress between about 0.1 kg/cm$^2$ and about 50 kg/cm$^2$.

18. A method of cleaning a substrate, the method comprising:

providing a substrate having a bevel edge;

providing a cleaning pad comprising a deformable ion exchange material comprising a styrenic resin having at least one amine, pyridinyl group, picolylamine group, aminopyridines, or combinations thereof; and polishing the substrate with the cleaning pad, wherein polishing the substrate with the cleaning pad comprises polishing a backside of the substrate.

* * * * *

UNITED STATES PATENT AND TRADEMARK OFFICE
CERTIFICATE OF CORRECTION

PATENT NO.   : 6,638,143 B2
DATED        : October 28, 2003
INVENTOR(S)  : Wang et al.

It is certified that error appears in the above-identified patent and that said Letters Patent is hereby corrected as shown below:

<u>Column 11</u>,
Line 56, please change "2000º C" to -- 200 º C --.

Signed and Sealed this

Thirtieth Day of March, 2004

JON W. DUDAS
*Acting Director of the United States Patent and Trademark Office*